United States Patent
Pan et al.

(10) Patent No.: US 8,010,073 B2
(45) Date of Patent: Aug. 30, 2011

(54) SYSTEM AND METHOD FOR ADJUSTING POWER AMPLIFIER OUTPUT POWER IN LINEAR DB STEPS

(75) Inventors: Meng-An Pan, Cerritos, CA (US); Bojko Marholev, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 857 days.

(21) Appl. No.: 10/761,625

(22) Filed: Jan. 22, 2004

(65) Prior Publication Data
US 2005/0164667 A1     Jul. 28, 2005

(51) Int. Cl.
*H04B 1/18* (2006.01)
(52) U.S. Cl. ............... 455/291; 455/127.2; 455/127.3; 455/522
(58) Field of Classification Search .............. 455/69, 455/116, 127.2, 127.3, 291, 522
See application file for complete search history.

(56) References Cited

U.S. PATENT DOCUMENTS

| | | | |
|---|---|---|---|
| 5,661,434 A | 8/1997 | Brozovich et al. | |
| 5,715,521 A * | 2/1998 | Fukasawa et al. | ............ 455/69 |
| 5,874,857 A | 2/1999 | Roth et al. | |
| 6,100,760 A | 8/2000 | Maruyama et al. | |
| 6,255,906 B1 * | 7/2001 | Eidson et al. | ............ 330/124 R |
| 6,700,440 B2 * | 3/2004 | Hareyama | ............ 330/51 |
| 6,968,201 B1 * | 11/2005 | Gandhi et al. | ............ 455/522 |
| 7,023,275 B2 * | 4/2006 | Miyamoto | ............ 330/254 |
| 2002/0118065 A1 | 8/2002 | Miyamoto | |
| 2002/0136325 A1 * | 9/2002 | Pehlke et al. | ............ 375/300 |
| 2004/0219898 A1 * | 11/2004 | Bult et al. | ............ 455/252.1 |

FOREIGN PATENT DOCUMENTS

| | | |
|---|---|---|
| EP | 0 620 639 A1 | 10/1994 |
| EP | 0 718 969 A2 | 6/1996 |
| EP | 0 930 717 A2 | 7/1999 |

OTHER PUBLICATIONS

European Search Report mailed Jun. 1, 2005 for European Appl. No. EP05000529.7, 3 pages.
European Patent Office Communication mailed Apr. 10, 2006 for European Appl. No. EP05000529.7, 4 pages.
European Patent Office Communication mailed Jan. 19, 2010 for European Appl. No. EP05000529.7, 4 pages.
European Patent Office Communication mailed Mar. 22, 2010 for European Appl. No. EP05000529.7, 4 pages.
European Patent Office Communication mailed Oct. 20, 2010 for European Appl. No. EP05000529.7, 9 pages.

* cited by examiner

*Primary Examiner* — Tuan H Nguyen
(74) *Attorney, Agent, or Firm* — Sterne, Kessler, Goldstein & Fox P.L.L.C.

(57) ABSTRACT

A power amplifier for use in a transmitter enables linear in dB output power control capability with 2 dB step sizes.

13 Claims, 4 Drawing Sheets

SYSTEM AND METHOD FOR ADJUSTING POWER AMPLIFIER OUTPUT POWER IN LINEAR DB STEPS

BACKGROUND

1. Technical Field

This invention relates generally to wireless communication systems, and more particularly, but not exclusively, to adjusting power amplifier output power in a transmitter.

2. Description of the Related Art

Communication systems are known to support wireless and wire lined communications between wireless and/or wire lined communication devices. Such communication systems range from national and/or international cellular telephone systems to the Internet to point-to-point in-home wireless networks. Each type of communication system is constructed, and hence operates, in accordance with one or more communication standards. For instance, wireless communication systems may operate in accordance with one or more standards including, but not limited to, IEEE 802.11, Bluetooth, advanced mobile phone services (AMPS), digital AMPS, global system for mobile communications (GSM), code division multiple access (CDMA), and/or variations thereof.

Depending on the type of wireless communication system, a wireless communication device, such as a cellular telephone, two-way radio, personal digital assistant (PDA), personal computer (PC), laptop computer, home entertainment equipment, et cetera communicates directly or indirectly with other wireless communication devices. For direct communications (also known as point-to-point communications), the participating wireless communication devices tune their receivers and transmitters to the same channel or channel pair (e.g., one of the plurality of radio frequency (RF) carriers of the wireless communication system) and communicate over that channel or channel pair. For indirect wireless communications, each wireless communication device communicates directly with an associated base station (e.g., for cellular services) and/or an associated access point (e.g., for an in-home or in-building wireless network) via an assigned channel. To complete a communication connection between the wireless communication devices, the associated base stations and/or associated access points communicate with each other directly, via a system controller, via the public switch telephone network, via the internet, and/or via some other wide area network.

For each wireless communication device to participate in wireless communications, it includes a built-in radio transceiver (i.e., receiver and transmitter) or is coupled to an associated radio transceiver (e.g., a station for in-home and/or in-building wireless communication networks, RF modem, etc.). As is known, the receiver receives RF signals, removes the RF carrier frequency from the RF signals directly or via one or more intermediate frequency stages, and demodulates the signals in accordance with a particular wireless communication standard to recapture the transmitted data. The transmitter converts data into RF signals by modulating the data to RF carrier in accordance with the particular wireless communication standard and directly or in one or more intermediate frequency stages to produce the RF signals.

Before transmitting wireless RF signals, a power amplifier amplifies the output power level so that a base station or other receiver can clearly receive the RF signals. Different systems adjust their output power in different ways.

Accordingly, a new system and method enables adjustment of the output power of power amplifiers in linear dB steps.

SUMMARY

Embodiments of the invention form a system and method that enable power control capability in a linear power amplifier from a maximum output power to a minimum output power in linear steps of 2 dBm there between. Accordingly, power amplifier output power can be adjusted linearly in dB according to power needs, thereby reducing overall power consumption.

In an embodiment of the invention, the method comprises: receiving an instruction to adjust the output power of power amplifier; powering on or off at least one branch of the power amplifier according to the received instruction to enable a logarithmic change in output power of the amplifier; and amplifying a signal according to the adjusted output power.

In another embodiment of the invention, a power amplifier control system comprises a plurality of branches for controlling transistors and a plurality of transistors. Each transistor is communicatively coupled to a branch of the plurality of branches. The transistors are arranged in a logarithmic scale, thereby enabling a logarithmic change in output power with the powering on or off of a transistor.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

DETAILED DESCRIPTION OF THE ILLUSTRATED EMBODIMENTS

The following description is provided to enable any person having ordinary skill in the art to make and use the invention, and is provided in the context of a particular application and its requirements. Various modifications to the embodiments will be readily apparent to those skilled in the art, and the generic principles defined herein may be applied to other embodiments and applications without departing from the spirit and scope of the invention. Thus, the present invention is not intended to be limited to the embodiments shown, but is to be accorded the widest scope consistent with the principles, features and teachings disclosed herein.

Figure 1:
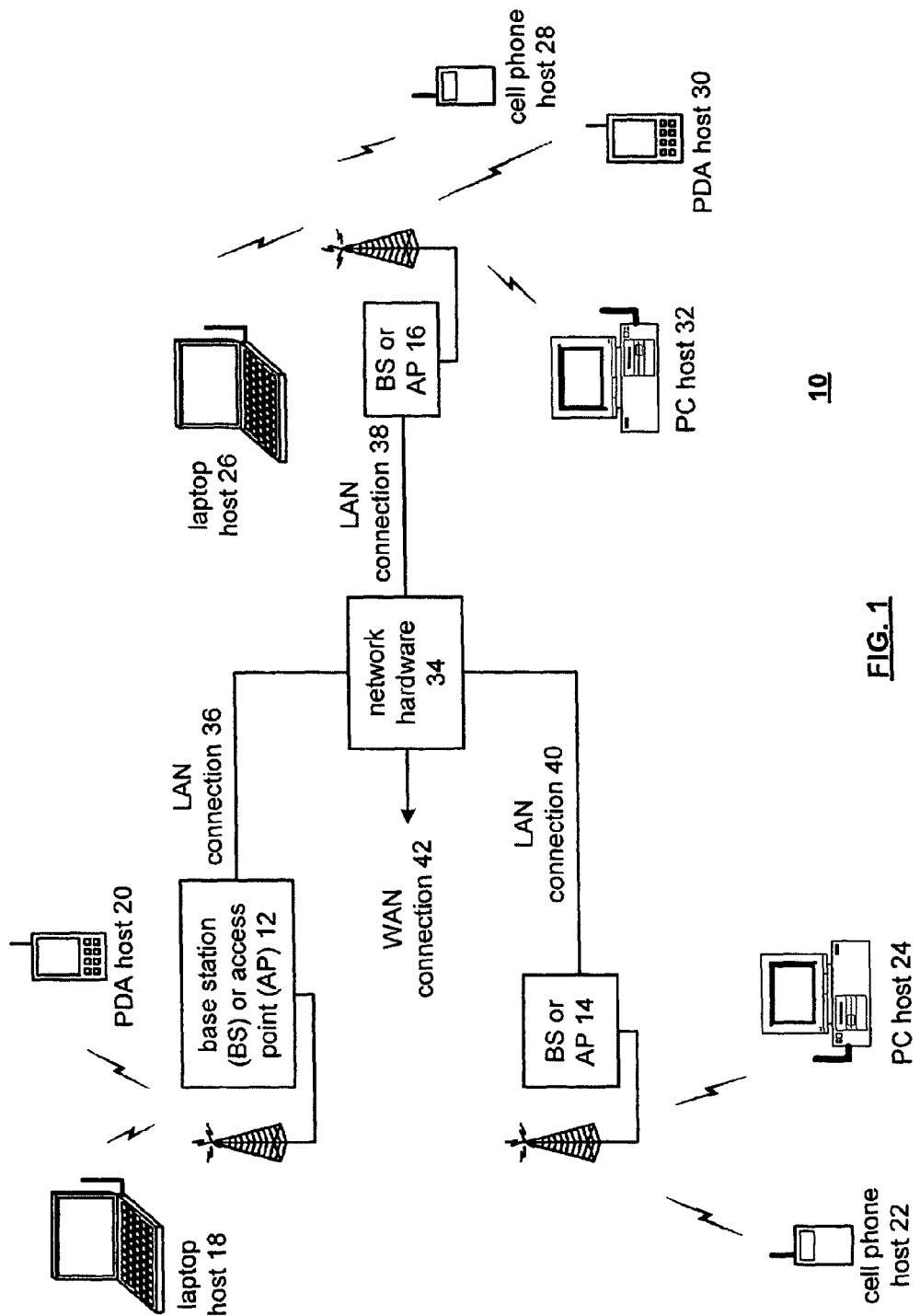
FIG. 1 is a block diagram illustrating a network system according to an embodiment of the present invention.

FIG. 1 is a block diagram illustrating a network system 10 according to an embodiment of the present invention. The system 10 includes a plurality of base stations and/or access points 12-16, a plurality of wireless communication devices 18-32 and a network hardware component 34. The wireless communication devices 18-32 may be laptop host computers 18 and 26, personal digital assistant hosts 20 and 30, personal computer hosts 24 and 32 and/or cellular telephone hosts 22 and 28. The details of the wireless communication devices will be described in greater detail with reference to FIG. 2.

The base stations or access points 12 are operably coupled to the network hardware 34 via local area network connections 36, 38 and 40. The network hardware 34, which may be a router, switch, bridge, modem, system controller, etc. provides a wide area network connection 42 for the communication system 10. Each of the base stations or access points 12-16 has an associated antenna or antenna array to communicate with the wireless communication devices in its area. Typically, the wireless communication devices register with a particular base station or access point 12-14 to receive services from the communication system 10. For direct connections (i.e., point-to-point communications), wireless communication devices communicate directly via an allocated channel.

Typically, base stations are used for cellular telephone systems and like-type systems, while access points are used for in-home or in-building wireless networks. Regardless of the particular type of communication system, each wireless communication device includes a built-in radio and/or is coupled to a radio. The radio includes a transmitter capable of adjusting power amplifier output power and therefore has characteristics of reduced power requirements, thereby extending the life of an associated power supply.

Figure 2:
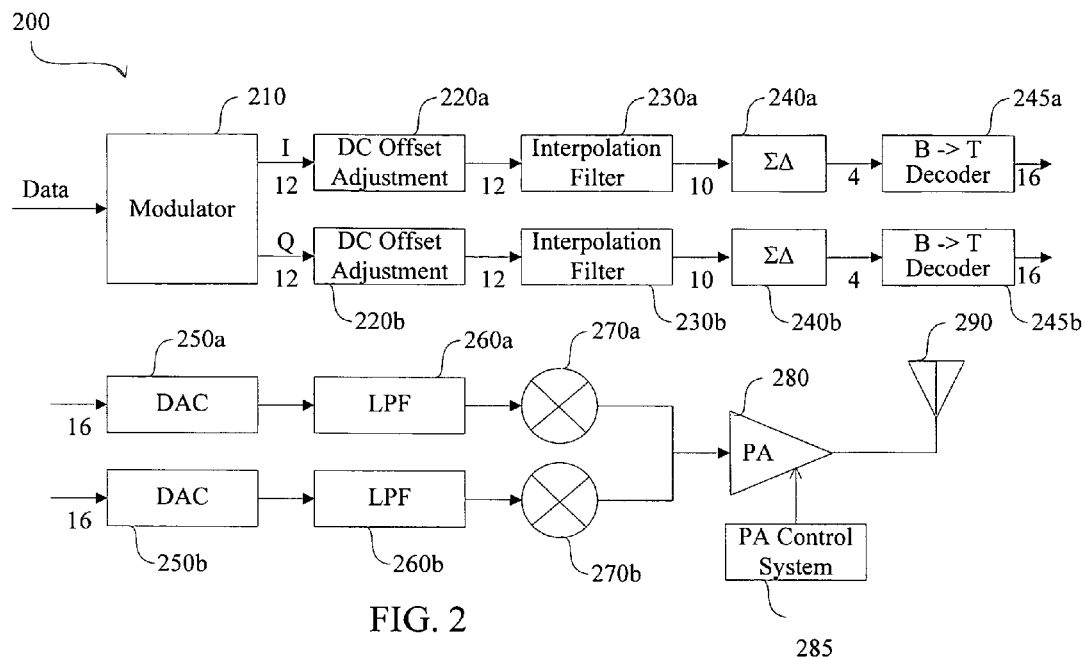
FIG. 2 is a block diagram illustrating a transmitter section according to an embodiment of the present invention.

FIG. 2 is a block diagram illustrating a transmitter section (or portion) 200 according to an embodiment of the present invention. Each wireless device of the network system 10 can include a transmitter portion 200 for transmitting data to other wireless network nodes. The transmitter section 200 includes a modulator 210 communicatively coupled to DC Offset Adjustment Engines 220a and 220b, which are communicatively coupled to Interpolation Filters 230a and 230b respectively. The Interpolation Filters 230a and 230b and communicatively coupled to delta sigma modulators 240a and 240b respectively (also referred to as sigma delta modulators). The delta sigma modulators 240a and 240b are communicatively coupled to binary to thermometer decoders 245a and 245b respectively. The decoders 245a and 245b are communicatively coupled to the DACs 250a and 250b respectively, which are communicatively coupled to low pass filters (LPFs) 260a and 260b. The LPFs 260a and 260b are communicatively coupled to mixers 270a and 270b respectively, which are each communicatively coupled to a power amplifier 280, which is communicatively coupled to an antenna 290. A power amplifier control system 285 is also communicatively coupled to the power amplifier 280.

The modulator 210 receives digital data from a processing component of a wireless device and performs quadrature amplitude modulation on the data. The modulation can include, for example, Gaussian Frequency Shift Keying (GFSK), 4-Phase Shift Keying (PSK), and/or 8-PSK. The modulator 210 provides quadrature outputs. In an embodiment of the invention, the sampling frequency is 12 MHz and output is 12 bits.

For FSK modulation, the I output can be represented as $I=\cos(2\pi f_c t + 2\pi f_d \int v dt)$ and the Q output can be represented as $I=\sin(2\pi f_c t + 2\pi f_d \int v dt)$. For PSK modulation, the I output can be represented as $I=Re(R(t)e^{j2\pi F_{if} t})$ and the Q output can be represented as $Q=IM(R(t)e^{j2\pi F_{if} t})$.

The DC offset adjustment engines 220a and 220b adjust the DC offset at the digital domain of the I and Q outputs from the modulator 210. The DC adjustment word length is 11 bits.

The interpolation filters 230a and 230b up sample the output from 12 MHz to 96 MHz. Higher OSR will make the following delta sigma modulation easier. For IF frequency $\leq 1$ MHz, the interpolation filters 230a and 230b filter out the 12 MHz image by more than 80 dBc. For IF of 2 MHz, the interpolation filters 230a and 230b filter out the 12 MHz by more than 60 dBc. Output of the interpolation filters 230a and 230b are 10 bits.

The delta sigma modulators 240a and 240b are second order delta sigma modulators that output 4 bits from a 16 bit input. The delta sigma modulators 240a and 240b also push quantization noise outside the LPF 260a and 260b bandwidth. The sampling frequency of the delta sigma modulators 240a and 240b are each 96 MHz. Input ranges from −2 to 1.75. Depending on control bit settings, incoming input can range from −1 to +1 or from −1.25 to +1.25. The extra range is reserved for signal excursions when modulation is present. With an input range of −1.25 to +1.25 and no modulation, output amplitude will be 5. The binary to thermometer decoders 245a and 245b convert the 4 bit output from delta sigma modulators 240a and 240b to thermometer 16 bits) according to Table I. In an embodiment of the invention, the DACs 250a incorporate the decoders 245a and 245b therein.

TABLE I

| ΔΣ Output | Binary Number | Mag | b15 | b14 | b13 | b12 | b11 | b10 | b9 | b8 | b7 | b6 | b5 | b4 | b3 | b2 | b1 | b0 |
|---|---|---|---|---|---|---|---|---|---|---|---|---|---|---|---|---|---|---|
| 7 | 0111 | 15 | 0 | 1 | 1 | 1 | 1 | 1 | 1 | 1 | 1 | 1 | 1 | 1 | 1 | 1 | 1 | 1 |
| 6 | 0110 | 14 | 0 | 0 | 1 | 1 | 1 | 1 | 1 | 1 | 1 | 1 | 1 | 1 | 1 | 1 | 1 | 1 |
| 5 | 0101 | 13 | 0 | 0 | 0 | 1 | 1 | 1 | 1 | 1 | 1 | 1 | 1 | 1 | 1 | 1 | 1 | 1 |
| 4 | 0100 | 12 | 0 | 0 | 0 | 0 | 1 | 1 | 1 | 1 | 1 | 1 | 1 | 1 | 1 | 1 | 1 | 1 |
| 3 | 0011 | 11 | 0 | 0 | 0 | 0 | 0 | 1 | 1 | 1 | 1 | 1 | 1 | 1 | 1 | 1 | 1 | 1 |
| 2 | 0010 | 10 | 0 | 0 | 0 | 0 | 0 | 0 | 1 | 1 | 1 | 1 | 1 | 1 | 1 | 1 | 1 | 1 |
| 1 | 0001 | 9 | 0 | 0 | 0 | 0 | 0 | 0 | 0 | 1 | 1 | 1 | 1 | 1 | 1 | 1 | 1 | 1 |
| 0 | 0000 | 8 | 0 | 0 | 0 | 0 | 0 | 0 | 0 | 0 | 1 | 1 | 1 | 1 | 1 | 1 | 1 | 1 |
| −1 | 1111 | 7 | 0 | 0 | 0 | 0 | 0 | 0 | 0 | 0 | 0 | 1 | 1 | 1 | 1 | 1 | 1 | 1 |
| −2 | 1110 | 6 | 0 | 0 | 0 | 0 | 0 | 0 | 0 | 0 | 0 | 0 | 1 | 1 | 1 | 1 | 1 | 1 |
| −3 | 1101 | 5 | 0 | 0 | 0 | 0 | 0 | 0 | 0 | 0 | 0 | 0 | 0 | 1 | 1 | 1 | 1 | 1 |
| −4 | 1100 | 4 | 0 | 0 | 0 | 0 | 0 | 0 | 0 | 0 | 0 | 0 | 0 | 0 | 1 | 1 | 1 | 1 |
| −5 | 1011 | 3 | 0 | 0 | 0 | 0 | 0 | 0 | 0 | 0 | 0 | 0 | 0 | 0 | 0 | 1 | 1 | 1 |
| −6 | 1010 | 2 | 0 | 0 | 0 | 0 | 0 | 0 | 0 | 0 | 0 | 0 | 0 | 0 | 0 | 0 | 1 | 1 |
| −7 | 1001 | 1 | 0 | 0 | 0 | 0 | 0 | 0 | 0 | 0 | 0 | 0 | 0 | 0 | 0 | 0 | 0 | 1 |
| −8 | 1000 | 0 | 0 | 0 | 0 | 0 | 0 | 0 | 0 | 0 | 0 | 0 | 0 | 0 | 0 | 0 | 0 | 0 |

The DACs 250a and 250b use thermometer coding to minimize sampling clock (96 MHz) glitches. The DACs 250a and 250b convert the digital signals to analog signals. The LPFs 260a and 260b receive the analog signals and filter out any glitches to generate a continuous signal. The mixers 270a and 270b convert the analog signals to an RF signal (e.g., 2.4 GHz for Bluetooth), which is then amplified by the power amplifier 280 and transmitted by the antenna 290.

The power amplifier 280, in an embodiment of the invention, is 200 μm by 0.15 μm and comprises 17 stages (or branches). The power amplifier 280 has a power control capability of 0 dB to −32 dB with a step size of 2 dB. The power amplifier 280, which will be discussed in further detail in conjunction with FIG. 3A and FIG. 3B below, adjusts output power based on input from the power amplifier control system 285.

The power amplifier control system 285, as will be discussed in further detail in conjunction with FIG. 4 below, controls the power amplifier 280 output power based on instructions received from a base station, other wireless node, or other source. For example, if a wireless device incorporating the transmitter section 200 is near a base station (e.g., BS 12), the base station can instruct the power amplifier control system 285 to decrease the output power on the power amplifier 280, thereby reducing power consumption and reducing interference in any other nearby wireless devices. The power amplifier control system 285 will then instruct the power amplifier 280 to turn off one or more branches to decrease output power. However, if the wireless device incorporating the transmitter section 200 is far away from a base station, the base station can instruct the power amplifier control system 285 to increase the output power of the power amplifier 280.

Figure 3A:
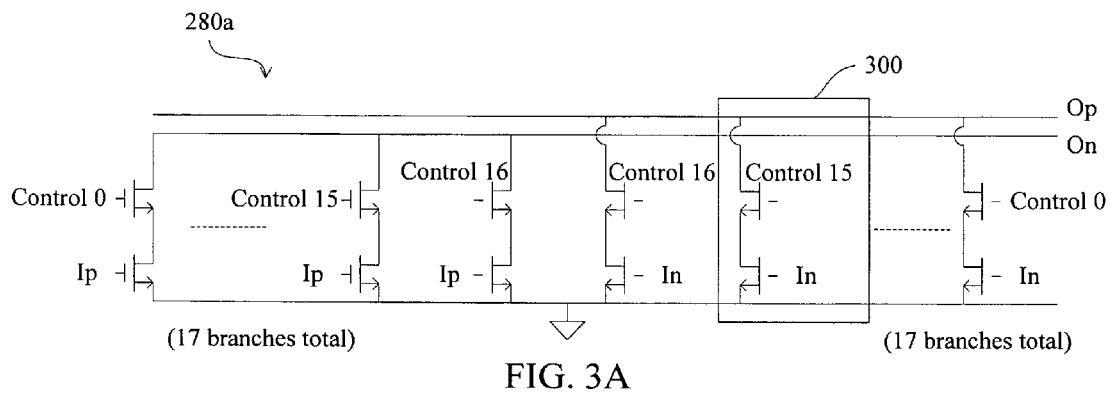
FIGS. 3A and 3B are block diagrams illustrating a power amplifier of the transmitter section of FIG. 2.

FIG. 3A is a block diagram illustrating a section 280a of power amplifier 280 of the transmitter section 200 (FIG. 2). The power amplifier section 280a comprises 17 branches such as branch 300. For maximum power, all branches are turned on. For minimum power, all branches except one are turned off. Further, power can be adjusted in 2 dB steps between adjacent power settings. To turn off each branch, cascade device bias is connected to each Control (Vdd/ground). In an embodiment of the invention, thermometer coded power control words are used to ensure monotonic power control.

In an embodiment of the invention, Vdd is equal to about 1.5V with available linear output swing of about 1V. The power amplifier 180 can provide linear output power up to about 5 dBm at the antenna 290. With a resistor coupled to each Vdd having a resistance of 158 Ohms, 1 can be equal to about 6.3 mA.

It will be appreciated by one of ordinary skill in the art that the number of stages and the amount of each step in power can be varied according to anticipated applications. Further, the maximum and minimum power can also vary according to anticipated applications. Further, it will be appreciated that the power amplifier can be employed in any device requiring power amplification.

Figure 3B:
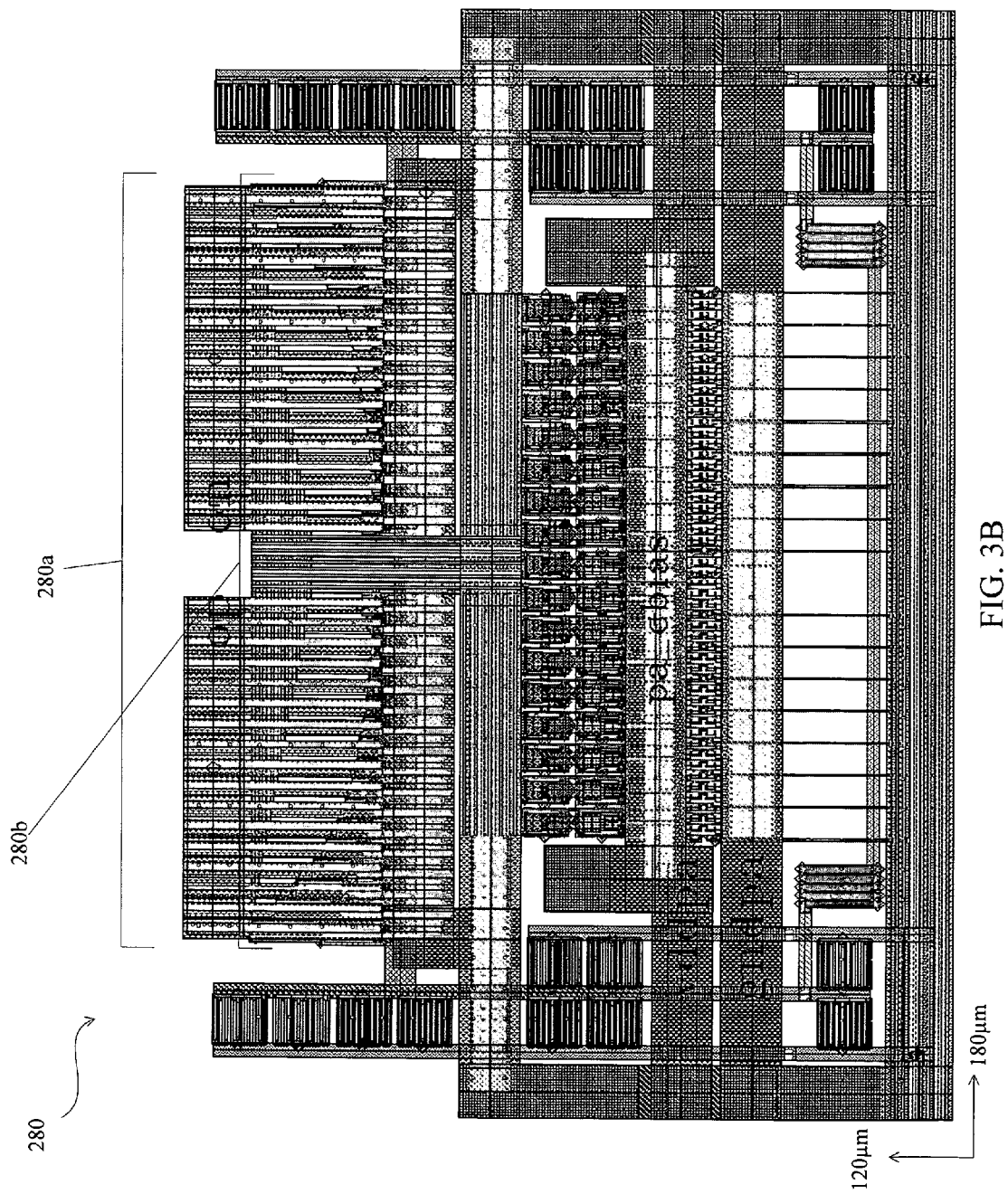

FIG. 3B is a block diagram illustrating the power amplifier 280 of the transmitter section 200 (FIG. 2). Each input (In) of the section 280a is communicatively coupled to a transistor of the transistors 280b, which vary in size to enable linear in dB steps in adjust output power levels of the amplifier 280 as shown in Table II below (e.g., transistors are arranged in a logarithmic scale).

TABLE II

| dB | % | Size (μm) | Δ |
|---|---|---|---|
| 0 | 1 | 200 | 41.14 |
| −2 | 0.794328235 | 158.8656 | 32.66 |
| −4 | 0.630957344 | 126.1915 | 25.96 |
| −6 | 0.501187234 | 100.2374 | 20.62 |
| −8 | 0.398107171 | 79.62143 | 16.38 |
| −10 | 0.316227766 | 63.24555 | 13 |
| −12 | 0.251188643 | 50.23773 | 10.34 |
| −14 | 0.199526231 | 39.90525 | 8.2 |
| −16 | 0.158489319 | 31.69786 | 6.52 |
| −18 | 0.125892541 | 25.17851 | 5.18 |
| −20 | 0.1 | 20 | 4.12 |
| −22 | 0.079432823 | 15.88656 | 3.26 |

TABLE II-continued

| dB | % | Size (μm) | Δ |
|---|---|---|---|
| −24 | 0.063095734 | 12.61915 | 2.62 |
| −26 | 0.050118723 | 10.02374 | 2.04 |
| −28 | 0.039810717 | 7.962143 | 1.64 |
| −30 | 0.031622777 | 6.324555 | 1.3 |
| −32 | 0.025118864 | 5.023773 | 5.02 |

Figure 4:
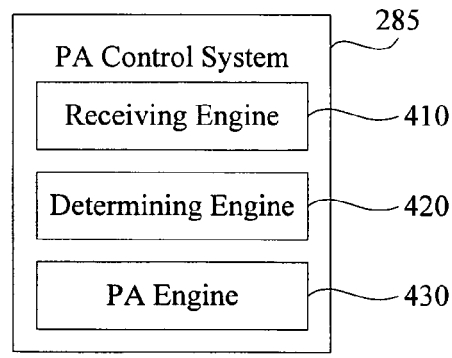
FIG. 4 is a block diagram illustrating a power amplifier control system of the transmitter section of FIG. 2.

FIG. 4 is a block diagram illustrating the power amplifier control system 285 of the transmitter section 200 (FIG. 2). The power amplifier control system 285 includes control logic that can be implemented as an Application Specific Integrated Circuit (ASIC), as software, or with other techniques. The power amplifier control system 285 includes a receiving engine 410, a determining engine 420, and a power amplifier engine 430. The receiving engine 410, via the antenna 290 or other source, receives instructions for adjusting the output power of the power amplifier 280. For example, if a device incorporating the power amplifier 280 is close to a base station, the base station will transmit instructions to the device to lower the output power to reduce power consumption and prevent interference with nearby devices. If the device incorporating the power amplifier 280 is far from a base station, the base station may instruct the device to increase output power. Instructions from the base station can be step wise or specify a numerical value for output power decrease or increase. For example, the base station may simply specify to increase or decrease output power or the base station may specify that a specific percentage or dB change in power.

In another embodiment of the invention, the receiving engine 410 receives instructions from other sources, such as other wireless devices. For example, if another wireless device is facing interference, it can transmit an instruction to decrease the power of the power amplifier 280, thereby decreasing interference. Alternatively, instructions may be generated by the device incorporating the power amplifier 280. For example, to conserve power when a power supply is running low, the receiving engine 410 may receive instructions to turn off stages in the power amplifier 280.

The determining engine 420 determines how many stages in the power amplifier 280 to shut off or power up based on the instructions received by the receiving engine 410 from the base station. If the instructions only specify increase or decrease power, then the determining engine 420 determines to power on or power off one stage of the power amplifier respectively. If the instructions specify a percentage increase or decrease, the determining engine 420 calculates how many stages need to be powered on or off, respectively, to meet the instruction's specifications.

After the determining engine 420 determines how many stages of the power amplifier 280 need to be powered up or down, the determining engine 420 notifies the power amplifier engine 430 accordingly. The power amplifier engine 430 then powers up or down the specified number of stages of the power amplifier 280 to meet the instruction's specifications. In an embodiment of the invention, the power amplifier engine 430 uses thermometer coded power control words to ensure monotonic power control in powering branches of the power amplifier 280 on and off.

Figure 5:
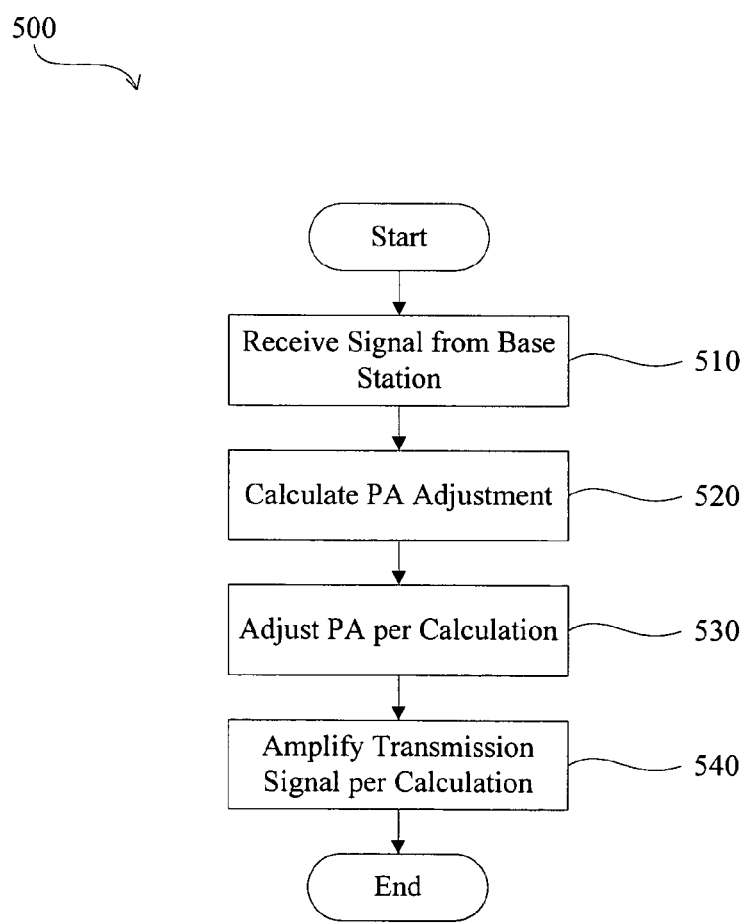
FIG. 5 is a flowchart illustrating a method of adjusting power amplifier output power.

FIG. 5 is a flowchart illustrating a method 500 of adjusting power amplifier output power. In an embodiment of the invention, the power amplifier 280 and the power amplifier control system 285 execute the method 500. First, a signal is received (510) from a base station or other source indicating whether to increase or decrease the power of the transmitting signal. After receiving (510), the adjustment of the power amplifier is calculated (520), e.g., how many stages to power up or down. If the received signal didn't identify a specific increase or decrease (i.e., only to increase or decrease) then a pre-specified number of stages (e.g., 1 or 2) may be powered on or off. The power amplifier is then adjusted (530) according to the calculation (520) and the signal to be transmitted is amplified (540) accordingly. The method 500 then ends. In an alternative embodiment of the invention, the method 500 can be repeated continuously.

The foregoing description of the illustrated embodiments of the present invention is by way of example only, and other variations and modifications of the above-described embodiments and methods are possible in light of the foregoing teaching. Components of this invention may be implemented using a programmed general purpose digital computer, using application specific integrated circuits, or using a network of interconnected conventional components and circuits. Connections may be wired, wireless, modem, etc. The embodiments described herein are not intended to be exhaustive or limiting. The present invention is limited only by the following claims.

What is claimed is:

1. A method, comprising:
   receiving an instruction to adjust an output power of a power amplifier;
   powering on or off at least one branch of the power amplifier according to the received instruction to enable a logarithmic change in the output power of the power amplifier; and
   amplifying a signal according to the adjusted output power,
   wherein the instruction specifies at least one of a percentage change in power and a decibel (dB) change in power.

2. The method of claim 1, further comprising transmitting the amplified signal.

3. The method of claim 1, wherein the powering on or off of a branch changes the output power of the power amplifier linearly in dB.

4. The method of claim 1, wherein thermometer coded power control words are used to power on and off branches of the power amplifier.

5. The method of claim 4, wherein the thermometer coded power control words ensure monotonic power control.

6. A system, comprising:
   means for receiving an instruction to adjust an output power of a power amplifier;
   means for powering on or off at least one branch of the power amplifier according to the received instruction to enable a logarithmic change in output power; and
   means for amplifying a signal according to the adjusted output power,
   wherein the instruction specifies at least one of a percentage change in power and a decibel (dB) change in power.

7. A system, comprising:
   a receiving engine capable of receiving an instruction to adjust an output power of a power amplifier; and
   a determining engine, communicatively coupled to the receiving engine, capable of determining how many branches of a power amplifier to power on or off according to the received instruction to enable a logarithmic change in output power; and
   a power amplifier engine, communicatively coupled to the determining engine and the power amplifier, capable of transmitting the determination to the power amplifier,
   wherein the instruction specifies at least one of a percentage change in power and a decibel (dB) change in power.

8. The system of claim 7, wherein powering on or off a branch changes the output power of the differential power amplifier linearly in dB.

9. The system of claim 7, wherein the power amplifier engine uses thermometer coded power control words to power on and off branches of the amplifier.

10. The system of claim 9, wherein the thermometer coded power control words ensure monotonic power control.

11. A power amplifier, comprising:
    a plurality of branches for controlling transistors; and
    a plurality of transistors, each transistor begin communicatively coupled to a branch of the plurality of branches,
    wherein the plurality of transistors are arranged in a logarithmic scale, thereby enabling a logarithmic change in output power with the powering on or off of a transistor.

12. The differential power amplifier of claim 11, wherein the powering on or off of a branch in the plurality of branches changes the output power of the power amplifier linearly in decibel.

13. A transmitter comprising a power amplifier according to claim 11.

* * * * *

UNITED STATES PATENT AND TRADEMARK OFFICE
CERTIFICATE OF CORRECTION

| | | |
|---|---|---|
| PATENT NO. | : 8,010,073 B2 | Page 1 of 1 |
| APPLICATION NO. | : 10/761625 | |
| DATED | : August 30, 2011 | |
| INVENTOR(S) | : Pan et al. | |

It is certified that error appears in the above-identified patent and that said Letters Patent is hereby corrected as shown below:

In column 8, line 34, "begin" should be replaced with --being--.

Signed and Sealed this
Fifteenth Day of November, 2011

David J. Kappos
*Director of the United States Patent and Trademark Office*